(12) United States Patent
Vossoughi

(10) Patent No.: US 10,289,791 B1
(45) Date of Patent: May 14, 2019

(54) ANCHOR-POINT BASED HIERARCHICAL ELECTRONIC DESIGN PROCESS

(71) Applicant: Cadence Design Systems, Inc., San Jose, CA (US)

(72) Inventor: Reza Vossoughi, Derry, NH (US)

(73) Assignee: Cadence Design Systems, Inc., San Jose, CA (US)

( * ) Notice: Subject to any disclaimer, the term of this patent is extended or adjusted under 35 U.S.C. 154(b) by 42 days.

(21) Appl. No.: 15/631,569

(22) Filed: Jun. 23, 2017

(51) Int. Cl.
  *G06F 17/50* (2006.01)

(52) U.S. Cl.
  CPC ...... *G06F 17/5072* (2013.01); *G06F 17/5081* (2013.01)

(58) Field of Classification Search
  CPC ................. G06F 17/5081; G06F 17/5072
  USPC ............. 716/111, 122, 124, 136; 703/15
  See application file for complete search history.

(56) References Cited

U.S. PATENT DOCUMENTS

| | | | | |
|---|---|---|---|---|
| 6,338,000 B1* | 1/2002 | Nakajima | ........ | G05B 19/40935 700/182 |
| 7,653,892 B1* | 1/2010 | Gennari | .............. | G06F 17/5068 716/50 |
| 10,152,153 B2* | 12/2018 | Jung | ...................... | G06F 3/0412 |
| 2010/0259537 A1* | 10/2010 | Ben-Himane | ............ | G06K 9/46 345/419 |
| 2012/0162454 A1* | 6/2012 | Park | ....................... | H04N 5/145 348/208.6 |
| 2014/0258953 A1* | 9/2014 | Dai | ..................... | G06F 17/5081 716/112 |
| 2016/0071451 A1* | 3/2016 | Yang | .................... | G09G 3/2092 345/204 |
| 2017/0365082 A1* | 12/2017 | Wolberg | ................. | G06T 11/60 |

* cited by examiner

*Primary Examiner* — Phallaka Kik
(74) *Attorney, Agent, or Firm* — Mark H. Whittenberger, Esq.; Holland & Knight LLP

(57) ABSTRACT

The present disclosure relates to a method for electronic circuit design. Embodiments may include providing, using a processor, an electronic design having a plurality of shapes associated therewith and displaying, at a graphical user interface, a first shape of the plurality of shapes. Embodiments may further include receiving a selection of an anchor point within the first shape, wherein the anchor point defines a fixed area associated with the first shape. Embodiments may also include identifying a plurality of bend lines associated with the plurality of shapes and determining an ordering of bending of at least two of the plurality of shapes.

20 Claims, 16 Drawing Sheets

ANCHOR-POINT BASED HIERARCHICAL ELECTRONIC DESIGN PROCESS

FIELD OF THE INVENTION

The present disclosure relates to electronic design automation (EDA), and more specifically, to a method for automatic hierarchical fan-out of one or more shapes along intersecting lines using an anchor point.

DISCUSSION OF THE RELATED ART

EDA utilizes software tools that may be used in the design and analysis of numerous electronic systems such as printed circuit boards (PCBs) and integrated circuits (ICs). Recent years have seen unprecedented expansion of functional requirements for PCB designs.

In some EDA products, a three-dimensional ("3D") canvas must provide support for bending operations along bend lines defined in a two-dimensional ("2D") database. A bend operation along any bend line may cause some objects to the right, left or both sides of that bend to transform or bend depending on their proximity to the bend line. If multiple bends are defined for a given flex area, a bending operation effect is cumulative, based on the ordering of the bends.

Existing EDA products only define bend lines, not any bend ordering, and it is cumbersome to have users define and manage these orders. This presents a challenge to provide bending orders for a given set of bend lines.

SUMMARY OF INVENTION

In one or more embodiments of the present disclosure, a computer-implemented method for electronic circuit design. The method may include providing, using a processor, an electronic design having a plurality of shapes associated therewith and displaying, at a graphical user interface, a first shape of the plurality of shapes. The method may further include receiving a selection of an anchor point within the first shape, wherein the anchor point defines a fixed area associated with the first shape. The method may also include identifying a plurality of bend lines associated with the plurality of shapes and determining an ordering of bending of at least two of the plurality of shapes.

One or more of the following features may be included. In some embodiments, the plurality of shapes may include polygons. At least a portion of the plurality of bend lines may separate the plurality of shapes. The method may include dividing the first shape into a subset of shapes. The method may also include determining at least one root parent in relation to the anchor point, wherein the root parent is a shape that is located nearer to the anchor point than a number of other shapes of the plurality of shapes. The method may further include determining at least one child shape in relation to the at least one root parent. The method may also include displaying at least one user selectable bending option at the graphical user interface.

In some embodiments, a computer-readable storage medium for having stored thereon instructions that when executed by a processor result in one or more operations. Operations may include providing, using a processor, an electronic design having a plurality of shapes associated therewith and displaying, at a graphical user interface, a first shape of the plurality of shapes. Operations may further include receiving a selection of an anchor point within the first shape, wherein the anchor point defines a fixed area associated with the first shape. Operations may also include identifying a plurality of bend lines associated with the plurality of shapes and determining an ordering of bending of at least two of the plurality of shapes.

One or more of the following features may be included. In some embodiments, the plurality of shapes may include polygons. At least a portion of the plurality of bend lines may separate the plurality of shapes. Operations may include dividing the first shape into a subset of shapes. Operations may also include determining at least one root parent in relation to the anchor point, wherein the root parent is a shape that is located nearer to the anchor point than a number of other shapes of the plurality of shapes. Operations may further include determining at least one child shape in relation to the at least one root parent. Operations may also include displaying at least one user selectable bending option at the graphical user interface.

In one or more embodiments of the present disclosure, a system having at least one processor for use with an electronic circuit design is provided. The at least one processor may be configured to receive an electronic design having a plurality of shapes associated therewith. The at least one processor may be further configured to display, at a graphical user interface, a first shape of the plurality of shapes. The at least one processor may be configured to receive a selection of an anchor point within the first shape, wherein the anchor point defines a fixed area associated with the first shape. The at least one processor may be further configured to identify a plurality of bend lines associated with the plurality of shapes and to determine an ordering of bending of at least two of the plurality of shapes.

One or more of the following features may be included. In some embodiments, the plurality of shapes may include polygons. At least a portion of the plurality of bend lines may separate the plurality of shapes. The at least one processor may be further configured to divide the first shape into a subset of shapes. The at least one processor may be further configured to determine at least one root parent in relation to the anchor point, wherein the root parent is a shape that is located nearer to the anchor point than a number of other shapes of the plurality of shapes. The at least one processor may be further configured to determine at least one child shape in relation to the at least one root parent.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
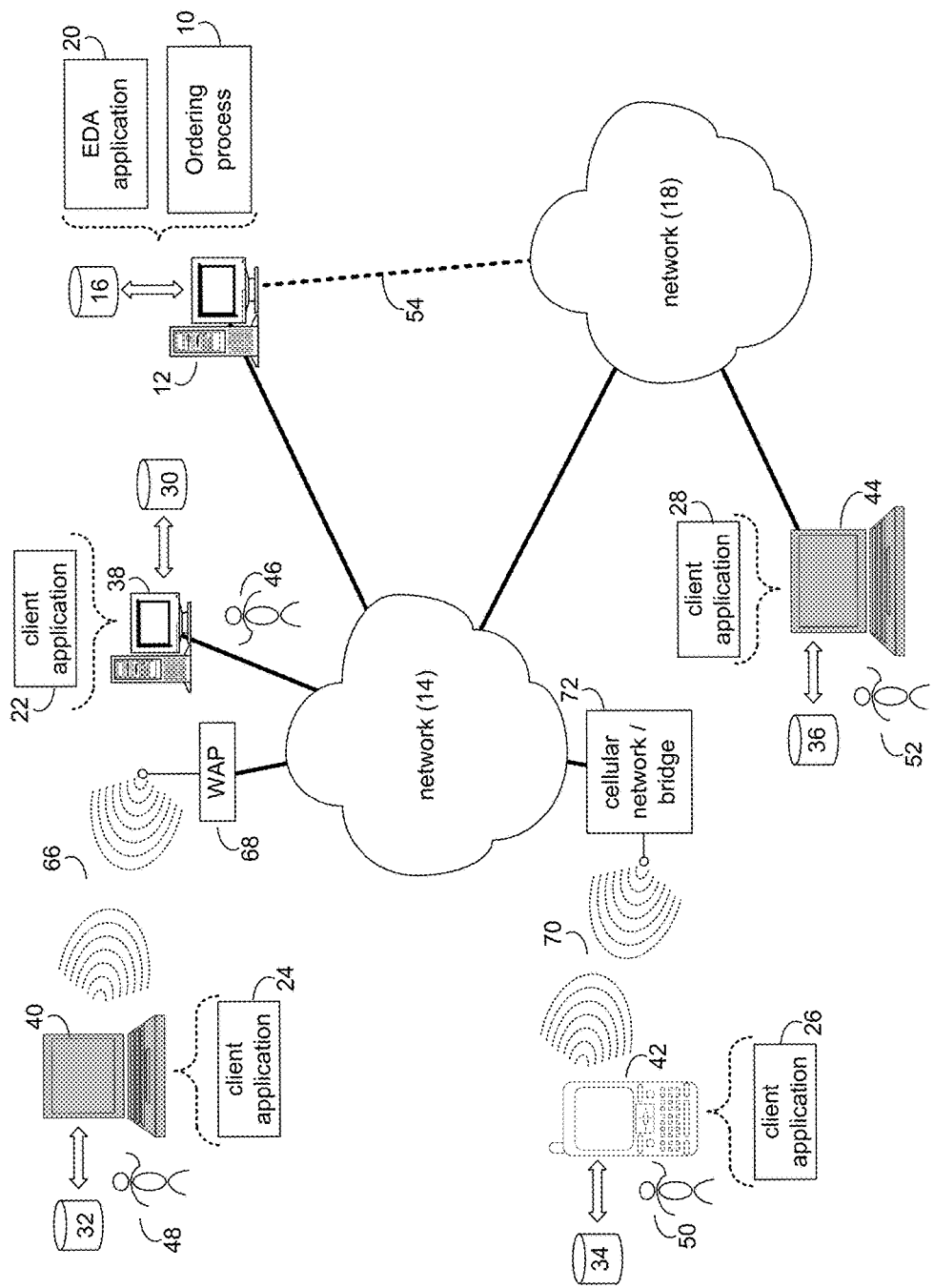
FIG. 1 is a system diagram depicting aspects of the ordering process in accordance with an embodiment of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As was discussed above, a 3D canvas must provide support for bending operations along bend lines defined in a 2D database. A bend operation along any bend line may cause some objects to the right, left or both sides of that bend to transform or bend depending on their proximity to the bend line. If multiple bends are defined for a given flex area, a bending operation effect is cumulative, based on the ordering of the bends.

Existing EDA products only define bend lines, not any bend ordering, and it is cumbersome to have users define and manage these orders. This presents a challenge to provide bending orders for a given set of bend lines.

Embodiments of the ordering process described herein may use one core piece of information in order to establish a hierarchy. Namely, the location of one or more anchor points. The phrase "anchor point", as used herein, may define an area that may be fixed and does not bend nor is effected by any bend operation. Accordingly, all bends may occur around the area that an anchor point is located in. The term "shape", as used herein, may include, but is not limited to, a polygon or any other suitable shape.

As is discussed in further detail below, the use of the anchor point and bend lines may make it possible to separate an outline of a design into discrete and exclusive polygons along bend lines. It is also possible to order these polygons based on their distance from the anchor point, thus establish a fanning out hierarchy needed for bend operations.

In some embodiments, multiple sets of hierarchical bend polygons could be established in a design, depending on the design outline shape and/or the location of an anchor point. Each set starts as its base the bend polygon adjacent to the exclusion area and each subsequent bend polygon becomes the child of the previous bend polygon based on its proximity to the anchor point. It should be noted that embodiments included herein may not rely purely on distance from the anchor point since design outlines are complex shapes with many contours. It follows the contour of the outline and established proximity based on that.

Embodiments of the ordering process described herein may utilize one or more electronic design automation techniques and/or tools such as those available from the Assignee of the subject application. Embodiments of ordering process may be configured to provide an approach allowing for the automatic, hierarchical, fan-out breakdown of a polygon along intersecting lines using one or more anchor points. Accordingly, the ordering process described herein may include a three-dimensional canvas configured to provide support for bending operations along bend lines defined in a two-dimensional database. As is discussed in further detail below, a bend operation along any bend line causes some objects to the right, left or both sides of that bend to transform or bend depending on their proximity to the bend line. If multiple bends are defined for a given flex area, bending operation effect is cumulative, based on the ordering of the bends. Embodiments included herein are directed towards an ordering process that may be configured to generate, either automatically, semi-automatically, and/or manually, an ordering to these bends.

Referring to FIG. 1, there is shown an ordering process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the ordering process may reside on and be executed, in whole or in part, by a client electronic device, such as a personal computer, notebook computer, personal digital assistant, or the like.

The instruction sets and subroutines of ordering process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Ordering process 10 may be a stand alone application, or may be an applet/application/script that may interact with and/or be executed within EDA application 20. In addition/as an alternative to being a server-side process, the ordering process may be a client-side process (not shown) that may reside on a client electronic device (described below) and may interact with an EDA client application (e.g., one or more of EDA client applications 22, 24, 26, 28). Further, the ordering process may be a hybrid server-side/client-side process that may interact with EDA application 20 and an EDA client application (e.g., one or more of client applications 22, 24, 26, 28). As such, the ordering process may reside, in whole, or in part, on server computer 12 and/or one or more client electronic devices. Accordingly, embodiments of ordering process 10 may include various techniques and configurations some of which may include, but are not limited to, one or more aspects of grid computing, peer-to-peer networking, and/or cloud-based system methodologies. Additionally and/or alternatively, ordering process 10 may incorporate one or more service oriented architectures, such as software as a service ("SaaS"), platform as a service ("PaaS"), and infrastructure as a service ("IaaS") models. Numerous other embodiments and configurations are also within the scope of the present disclosure.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize ordering process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

As used herein, a "Design", a "design database", or a "design file" may refer to aspects of an Electronic Design Automation (EDA) database of information, which may describe a Printed Circuit Board (PCB), an Integrated Circuit (IC), an IC Package, or any other suitable electronic device. In some embodiments, a design file may include geometries, attributes, properties, linkages as standalone items and they may also be included within complex hierarchies. The geometries may be made up of simple points to extremely complex polygon shapes including arcs and holes within the polygon. These complex polygon shapes may be compared against all objects in and around them to check for conflicts.

Figure 2:
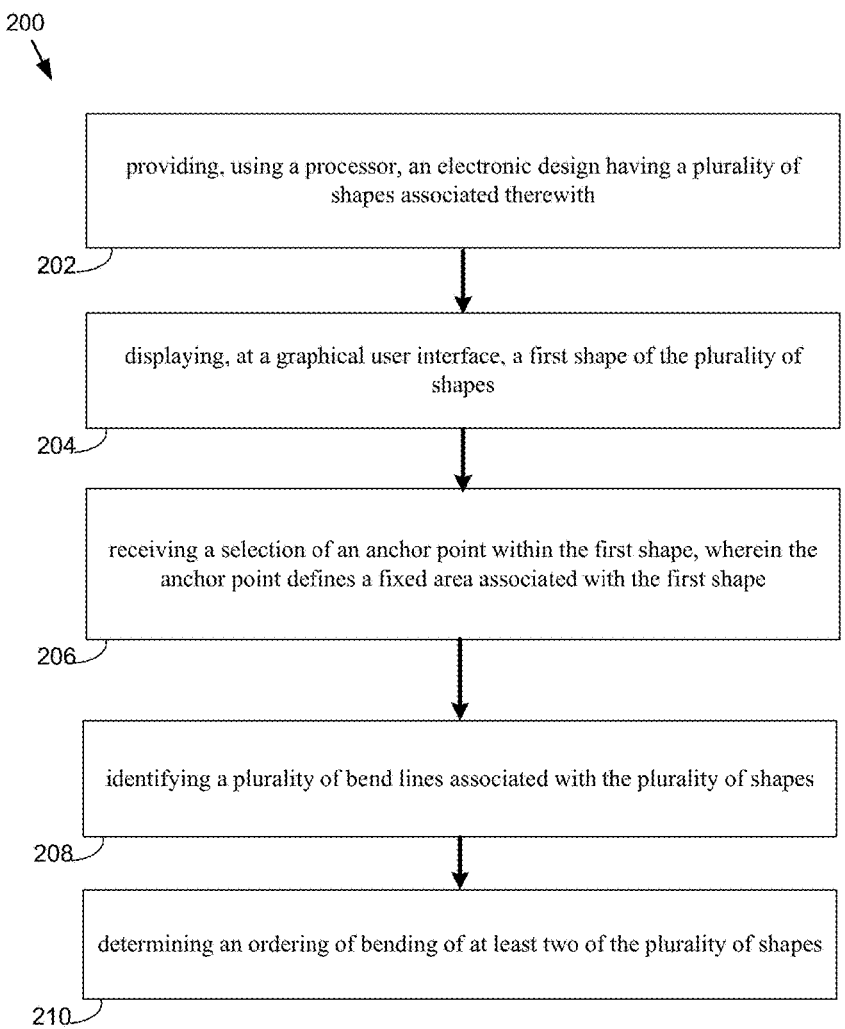
FIG. 2 is a flowchart depicting operations consistent with the ordering process of the present disclosure.

Referring also to FIG. 2, an embodiment showing a flowchart 200 depicting operations consistent with embodiments of ordering process 10 is provided. Ordering process 10 may include providing (202), using a processor, an electronic design having a plurality of shapes associated therewith and displaying (204), at a graphical user interface, a first shape of the plurality of shapes. Embodiments may further include receiving (206) a selection of an anchor point within the first shape, wherein the anchor point defines a fixed area associated with the first shape. Embodiments may also include identifying (208) a plurality of bend lines associated with the plurality of shapes and determining (210) an ordering of bending of at least two of the plurality of shapes. Numerous other operations are also within the scope of the present disclosure.

Figure 3:
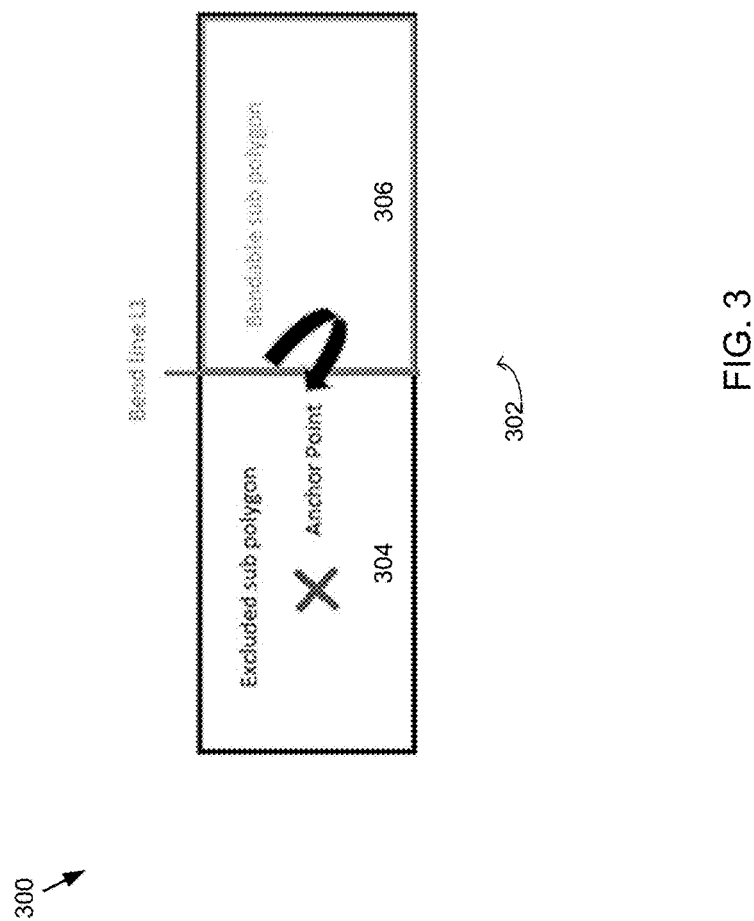
FIG. 3 is a schematic depicting aspects of the ordering process in accordance with an embodiment of the present disclosure.

Referring now to FIG. 3, an embodiment of ordering process 10 showing a polygon 302 having an excluded sub-polygon 304 and a bendable sub-polygon 306 is provided. Polygon 302 includes one bend line L1 and an anchor point X, which results in an excluded sub-polygon 304 and a bendable sub-polygon 306. In operation, and given a polygon "P" (in this example polygon 302), a set of non self-intersecting lines "L" that cross the polygon and one (or more) anchor points "X" inside the polygon, ordering process 10 may be configured to divide the polygon into a set of non-overlapping sub-polygons "S" (in this example sub-polygons 304 and 306) with one or more of the characteristics discussed below. In some embodiments, each polygon in S may not contain any anchor point. Embodiments of ordering process 10 may be configured to sort the set of non-overlapping sub-polygons S in an ascending order from any anchor point along the outline of P (e.g. polygon 302). Ordering process 10 may then establish relationships between polygons in the set in an ascending order from any anchor point with polygons adjacent to the region that contain any anchor point being identified as root parents. In some embodiments, each root parent may contain subsequent child polygons that are farther from an anchor point. In this way, each child polygon in the set has its parent set to the previous child. The resultant S has ordered polygons with a hierarchy describing a fan-out pattern from anchor points along P outline.

Figure 4:
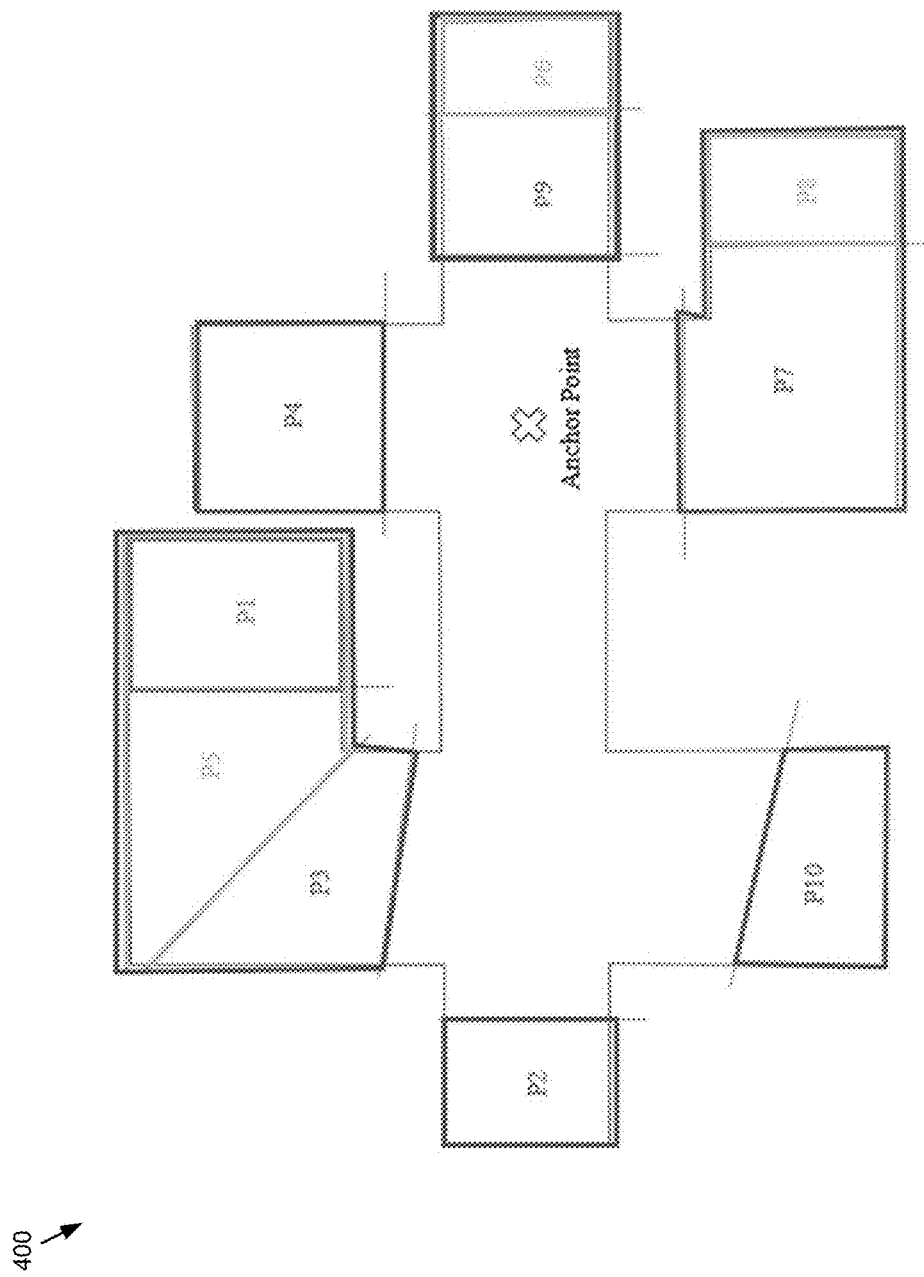
FIG. 4 is a schematic depicting aspects of the ordering process in accordance with an embodiment of the present disclosure.

Referring also to FIG. 4, an embodiment of ordering process 10 showing multiple polygons is provided. In this example there may be random lines L: {L1, L2 . . . , L10} that may be crossing the polygon P. After polygon Boolean operations, the resulting S will contain S: {P2, P4, P10, P3: {P5:P1}, P7: {P8}, P9: {P6} } as illustrated in FIG. 4. Accordingly, the resulting polygons is S having child-parent relations established, which is discussed in further detail below.

Figure 5:
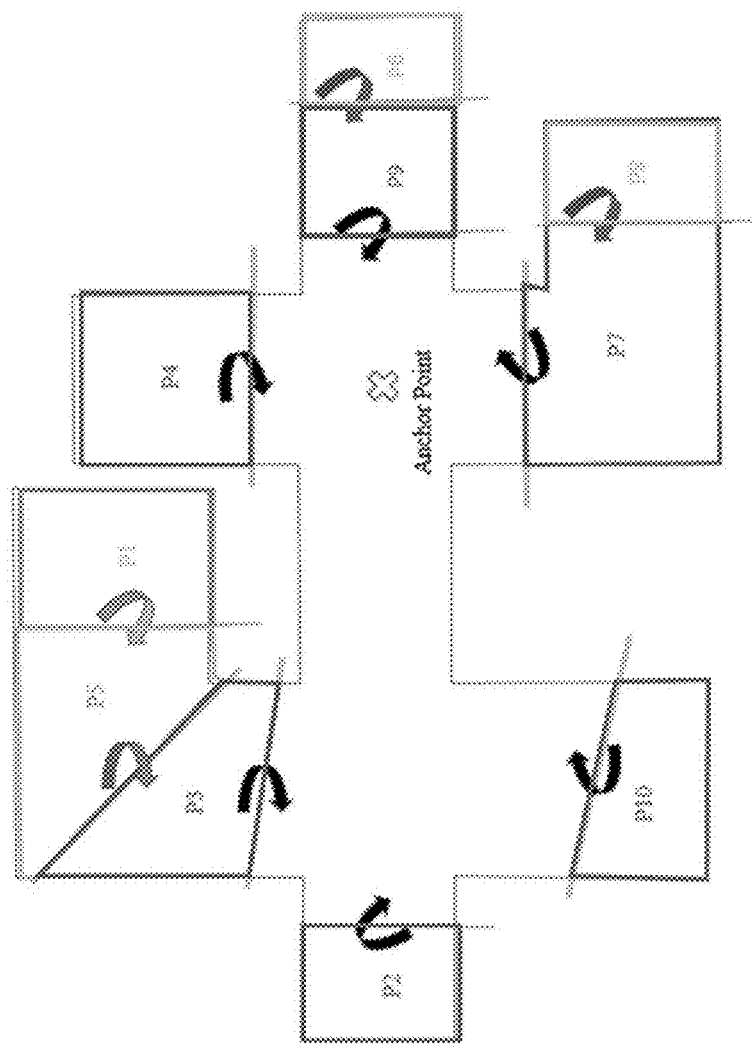
FIG. 5 is a schematic depicting aspects of the ordering process in accordance with an embodiment of the present disclosure.

In operation, and referring also to FIG. 5, ordering process 10 may perform a number of operations in order to generate the child-parent set S. For each line, ordering process 10 may break polygon P into two sub-polygons, using acceptable polygon operations. The process may then discard the sub-polygon that contains the anchor point and add the sub-polygon to S. This is the primary algorithm for exclusionary operation as illustrated in FIG. 5:

S: {P1, P2, P3, P4, P5, P6, P7, P8, P9, P10}

For each of the polygons in S, ordering process 10 may identify the lines that are inside that polygon and move the associated sub-polygon to its child list. This resulting set S is as shown in FIG. 5.

S: {P2, P3:{P1:P5}, P4, P7:{P8}, P9:{P6}, P10}

In some embodiments, ordering process 10 may be configured to sort the children list for each member in S in increasing number of polygon contained in each. This may be necessary for the Boolean operation described in next step:

S: {P2 P3:{P5:P1} P4 P7:{P8} P9:{P6} P10}

In some embodiments, ordering process 10 may be configured to begin with the item having the largest number of children. Ordering process 10 may utilize Boolean operations (e.g., 'A not B') to subtract the first child from the parent. This gives an autonomous polygon for the parent. Then, for each child, ordering process 10 may subtract the next child polygon to get the autonomous polygon for the given child. The last child will always be autonomous. This results in final result in S as shown in FIG. 5 having the desired ordering:

S: {P2 P4 P10 P3:{P5:P1} P7:{P8} P9: {P6}}

Set S now contains a list of polygons with the child parent relations established. This methodology is independent of the main polygon shape and no other information other than the anchor points may be needed to automatically generate ordered polygons fanning out from the anchor point.

Figure 6:
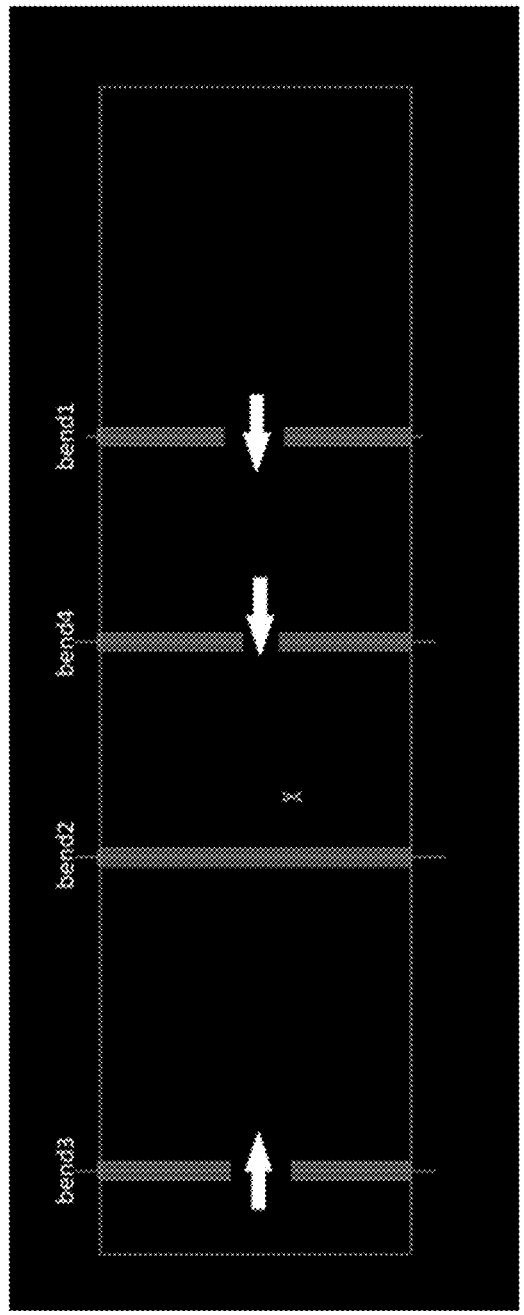
FIG. 6 is a schematic depicting aspects of the ordering process in accordance with an embodiment of the present disclosure.

Referring now to FIG. 6, an embodiment of ordering process 10 showing a graphical user interface 600 is provided. GUI 600 shows an example of a rigid-flex design having four bends in a 2D canvas. As shown in FIG. 6, an anchor point "X" is shown between Bend 2 and Bend 4. This results in Bend 1 being a child of Bend 4 and Bend 3 being a child of Bend 2.

Figure 7:
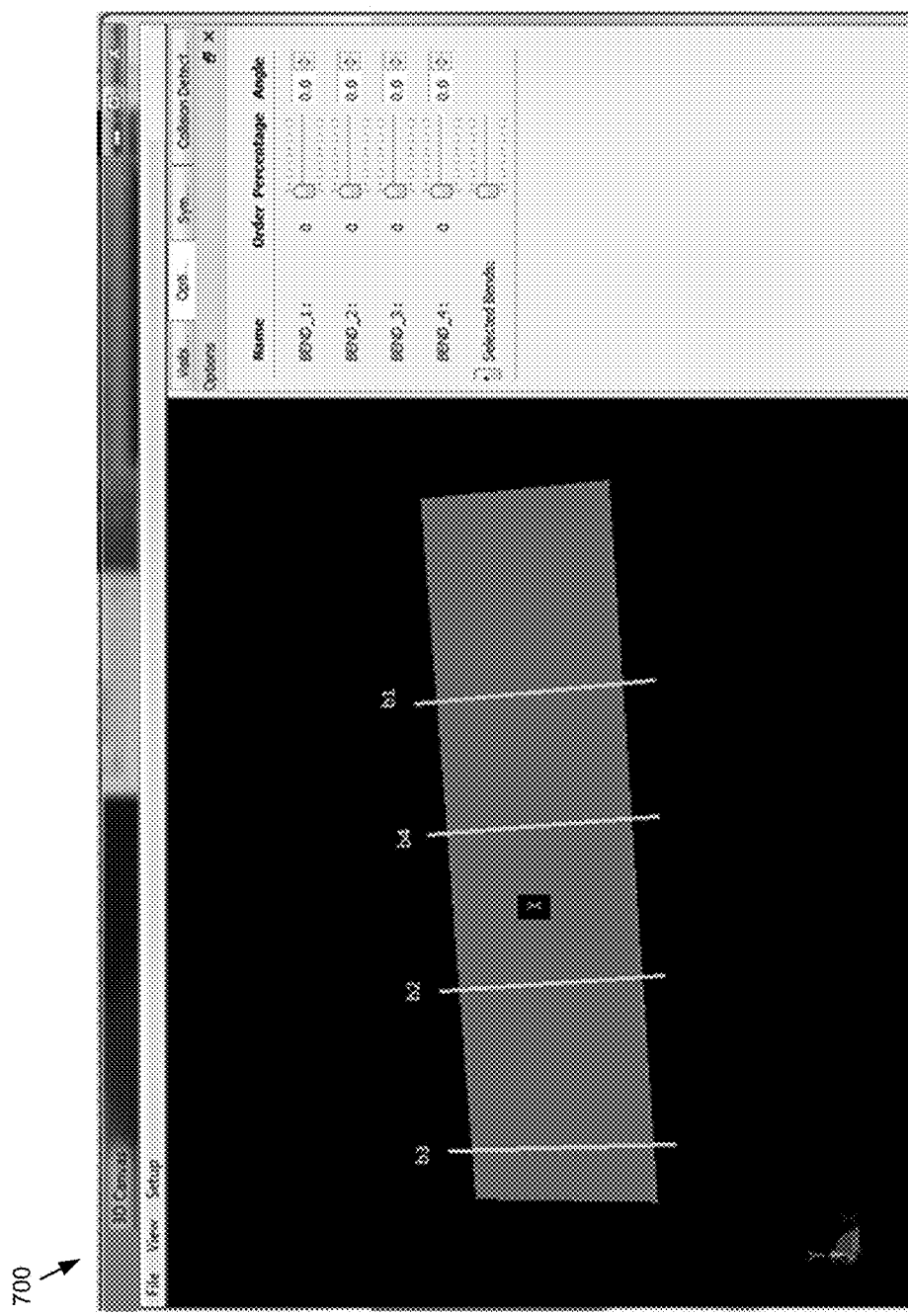
FIG. 7 is a graphical user interface depicting aspects of the ordering process in accordance with an embodiment of the present disclosure.

Referring now to FIG. 7, an embodiment of ordering process 10 showing a graphical user interface 700 is provided. GUI 700 shows an example of the design of FIG. 6 in a 3D canvas without any bend operation performed. In some embodiments, the options tab on the right of the GUI may allow users, via ordering process 10, to bend objects along each bend line within a range of rotation angles defined for each bend line.

Figure 8:
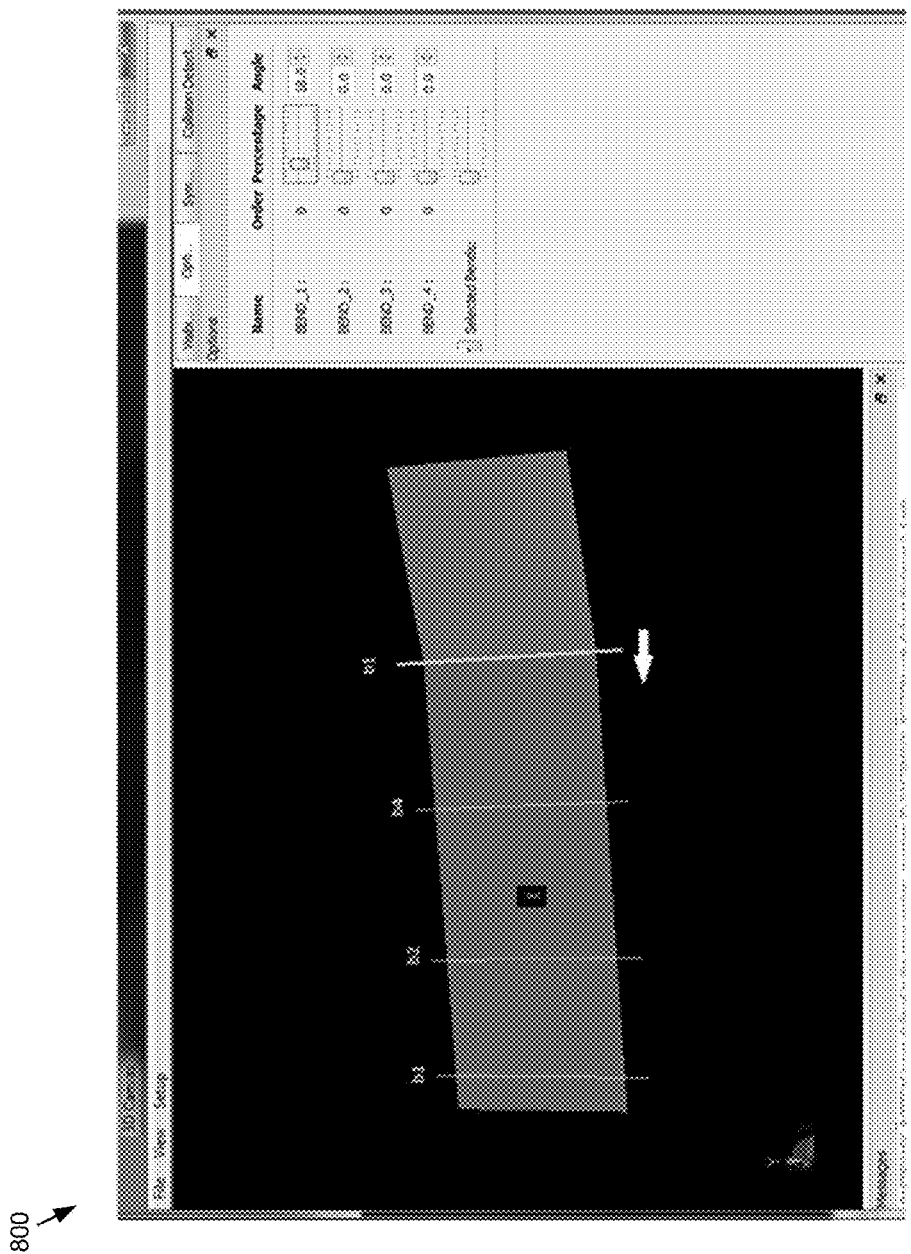
FIG. 8 is a graphical user interface depicting aspects of the ordering process in accordance with an embodiment of the present disclosure.

Referring now to FIG. 8, an embodiment of ordering process 10 showing a graphical user interface 800 is provided. GUI 800 shows an example where Bend 1 is bent with an angle of 18 degrees. However, no other bend area has been affected since Bend 1 does not have a child.

Figure 9:
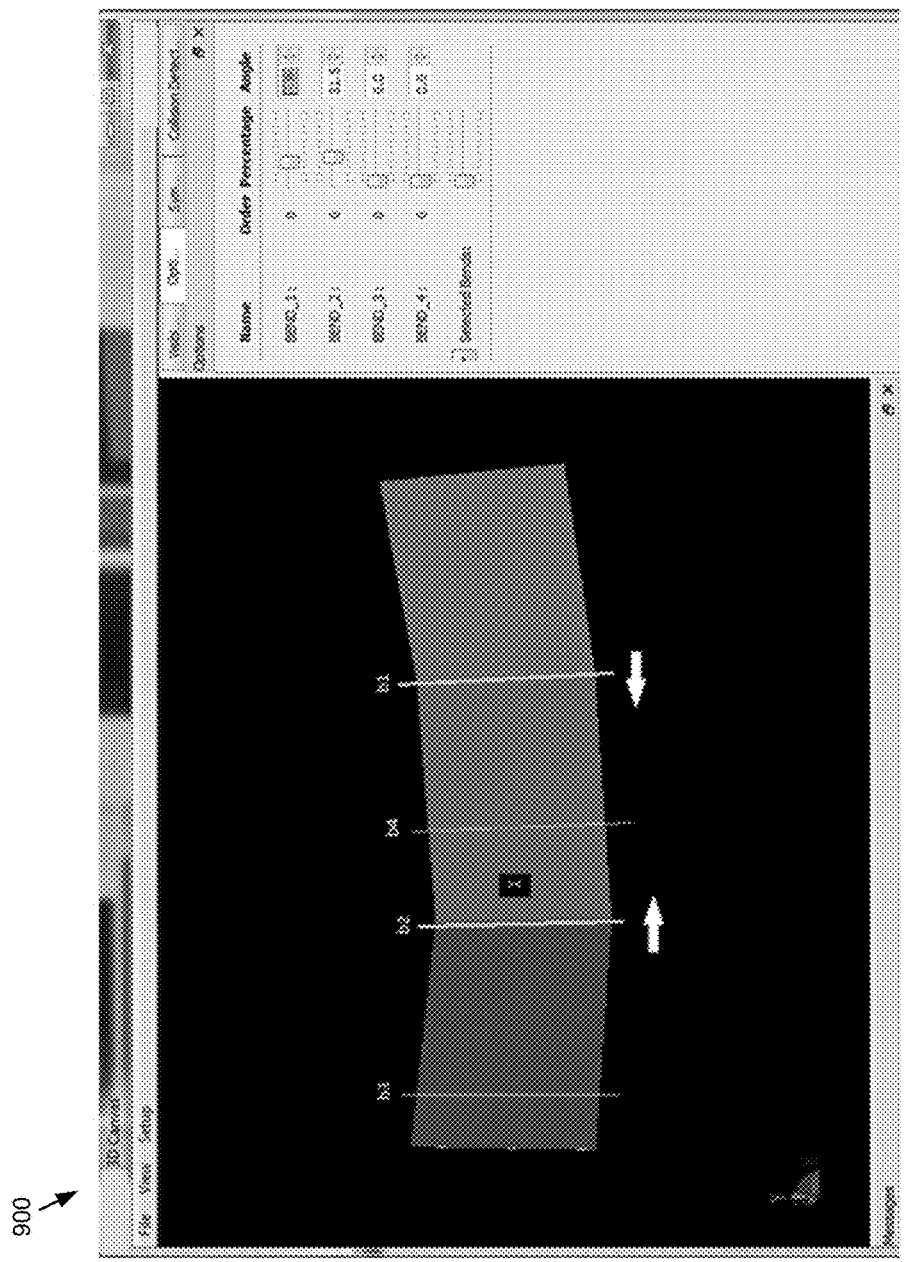
FIG. 9 is a graphical user interface depicting aspects of the ordering process in accordance with an embodiment of the present disclosure.

Referring now to FIG. 9, an embodiment of ordering process 10 showing a graphical user interface 900 is provided. GUI 900 shows an example of the design where Bend 2 is also bent. As such, Bend 3 may rotate as well since it is a child of Bend 2. In this example, Bend 1 is set to 18.2 degrees, Bend 2 is set to 31.5 degrees, Bend 3 is set to 0 degrees, and Bend 4 is set to 0 degrees.

Figure 10:
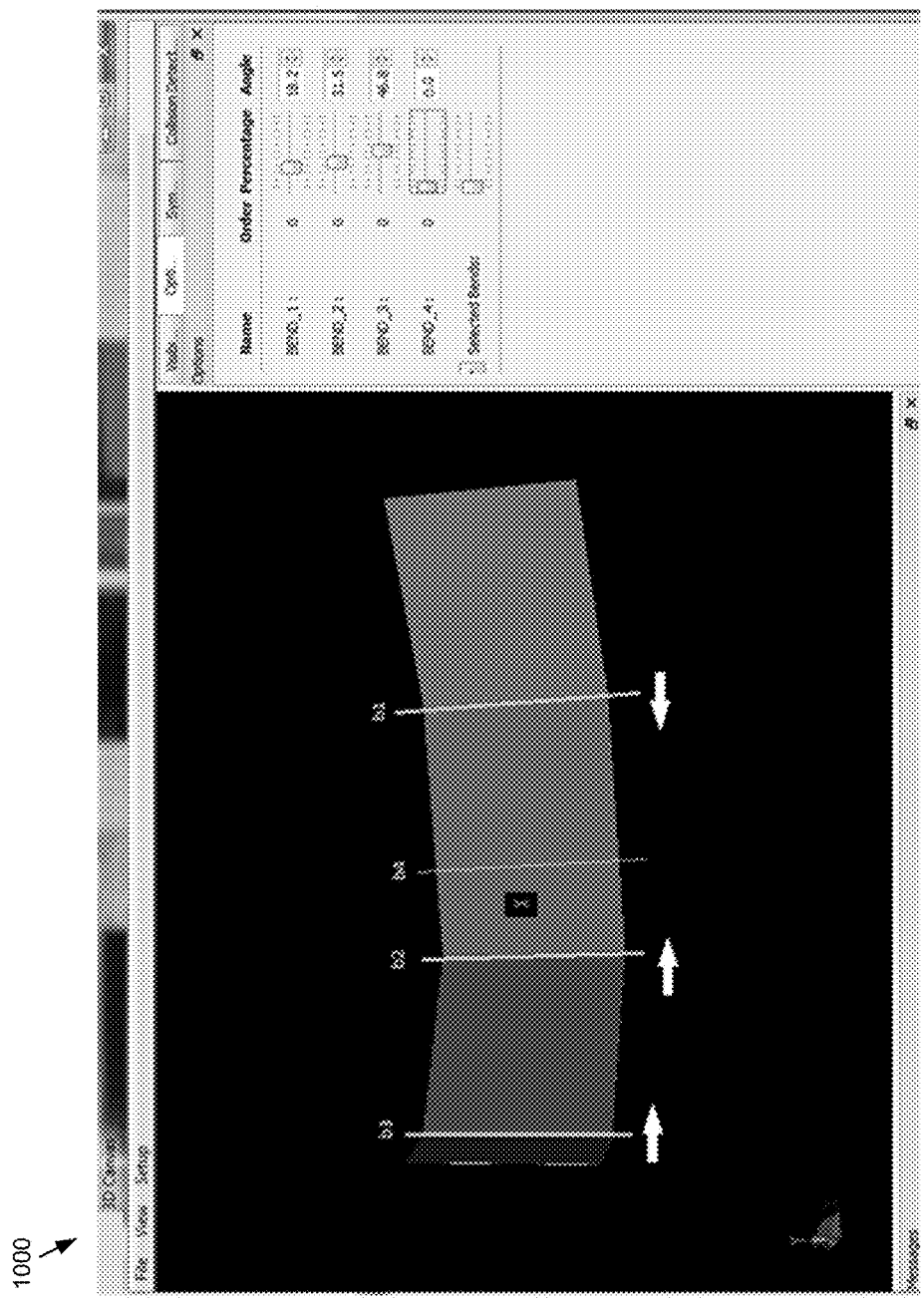
FIG. 10 is a graphical user interface depicting aspects of the ordering process in accordance with an embodiment of the present disclosure.

Referring now to FIG. 10, an embodiment of ordering process 10 showing a graphical user interface 1000 is provided. GUI 1000 shows an example of the design where Bend3 is bent, therefore no other bends are affected. In this example, Bend 1 is set to 18.2 degrees, Bend 2 is set to 31.5 degrees, Bend 3 is set to 46.8 degrees, and Bend 4 is set to 0 degrees.

Figure 11:
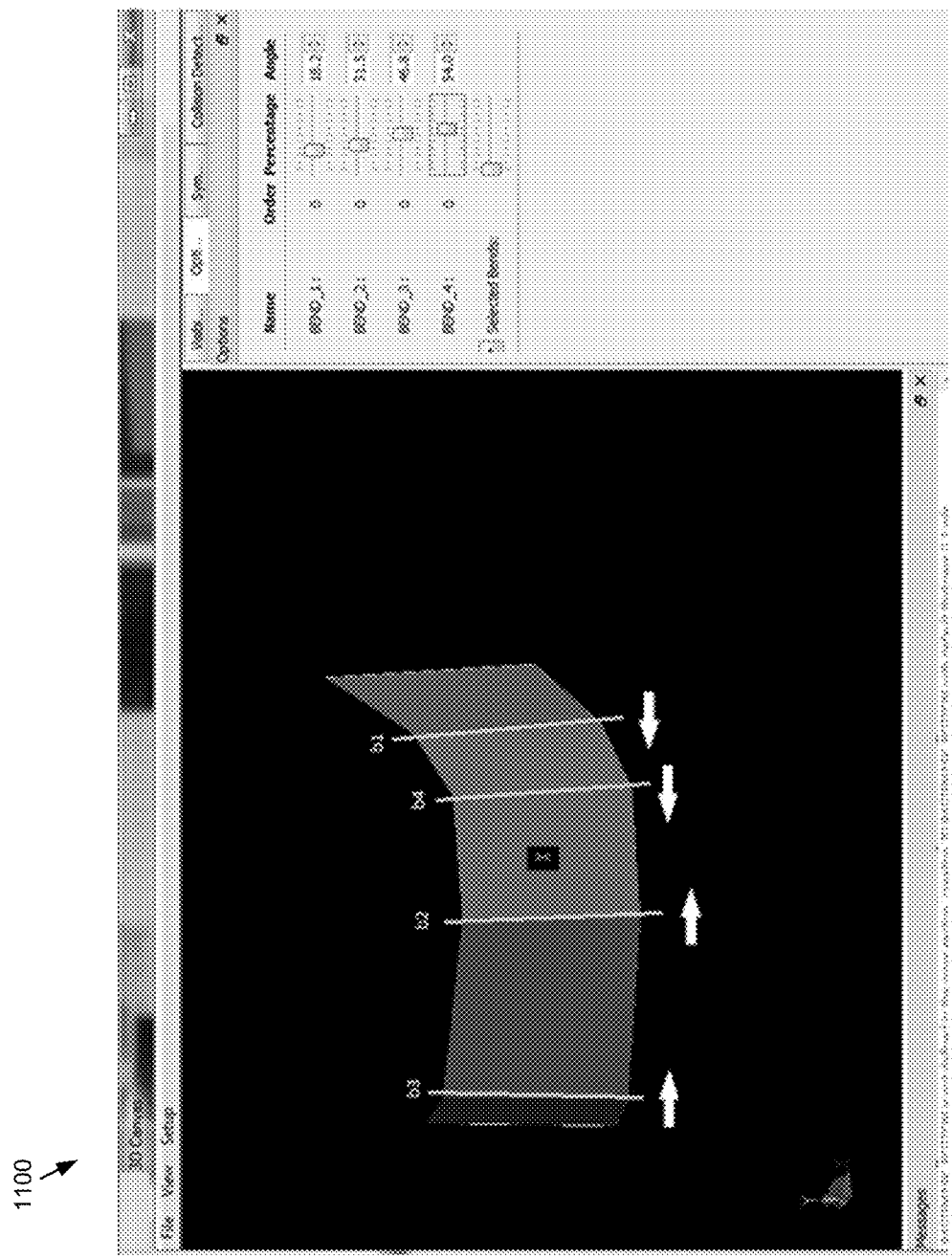
FIG. 11 is a graphical user interface depicting aspects of the ordering process in accordance with an embodiment of the present disclosure.

Referring now to FIG. 11, an embodiment of ordering process 10 showing a graphical user interface 1100 is provided. GUI 1100 shows an example of the design where Bend 4 is bent, therefore Bend 1 will rotate as well. In this example, Bend 1 is set to 18.2 degrees, Bend 2 is set to 31.5 degrees, Bend 3 is set to 46.8 degrees, and Bend 4 is set to 54 degrees.

Figure 12:
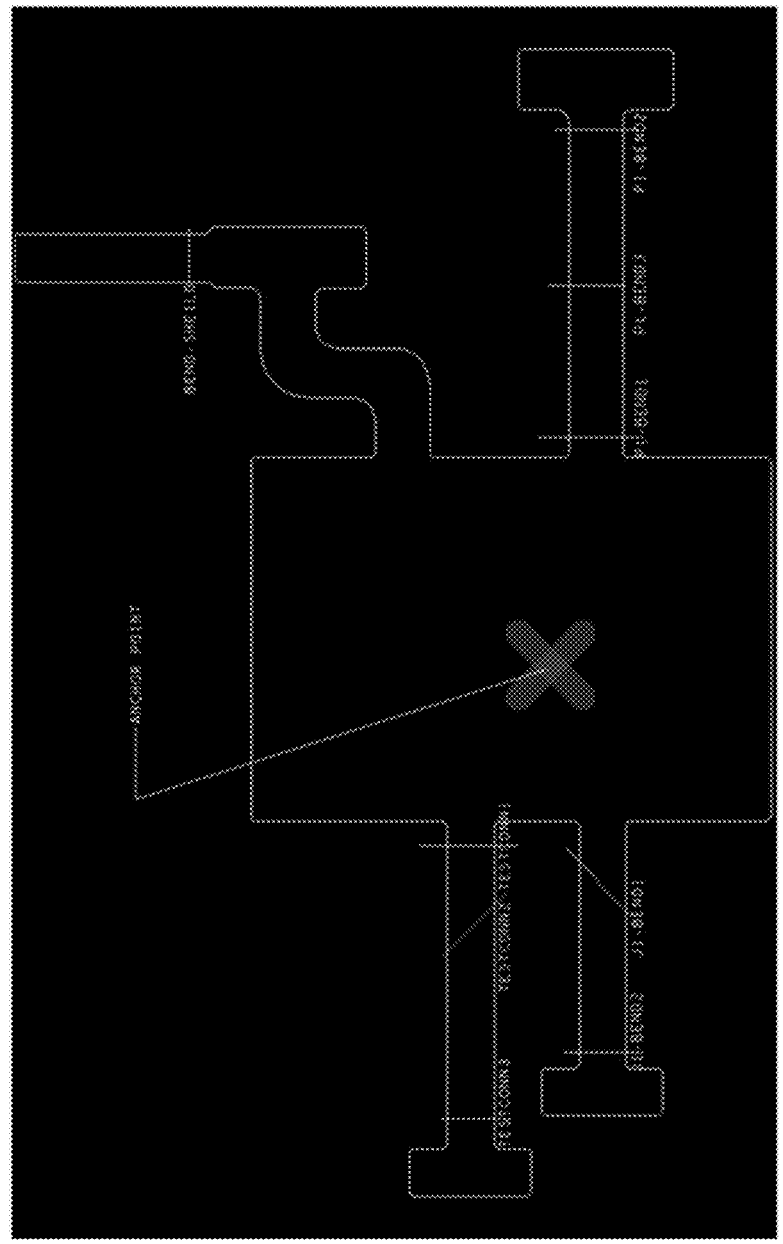
FIG. 12 is a graphical user interface depicting aspects of the ordering process in accordance with an embodiment of the present disclosure.
Figure 13:
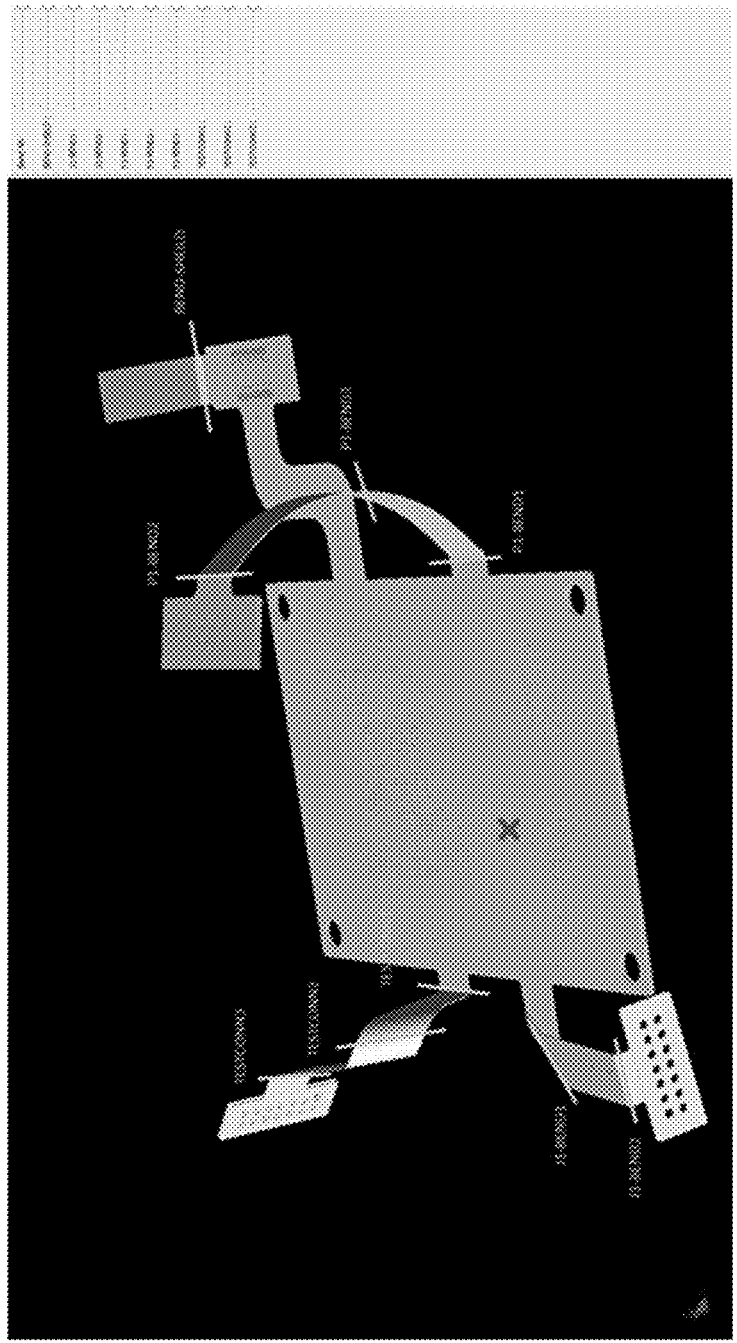
FIG. 13 is a graphical user interface depicting aspects of the ordering process in accordance with an embodiment of the present disclosure.

Referring now to FIGS. 12-13, additional exemplary embodiments consistent with ordering process 10 are provided. The GUIs provided in FIGS. 12-13 show a rigid-flex design in a 2D canvas. In some embodiments, the options tab on the right side of the GUI in FIG. 12 may allow users, via ordering process 10, to control visibility and selection of objects in a canvas area. Additionally and/or alternatively, the options tab on the right of the GUI in FIG. 13 may allow users to bend objects along each bend line within a range of rotation angles defined for each bend line. These figures also illustrate the ordering process 10 operating upon a design with multiple bend hierarchy fan-outs on both sides. In this particular example, four sets of bend hierarchies are established as shown in FIG. 12:

Set 1: TESTCONN1:TESTCON2:TESTCONN3
Set 2: J1-BEND1:J1-BEND2
Set 3: P1-BEND1:P1-BEND3:P1-BEND2
Set 4: BEND-SHIELD

FIG. 13 depicts a GUI 1300 showing bending operations performed along bend lines illustrating the four bend hierarchies. In some embodiments, the options tab on the right of the GUI in FIG. 13 may allow users, via ordering process 10, to bend objects along each bend line within a range of rotation angles defined for each bend line.

Figure 14:
FIG. 14 is a graphical user interface depicting aspects of the ordering process in accordance with an embodiment of the present disclosure.
Figure 15:
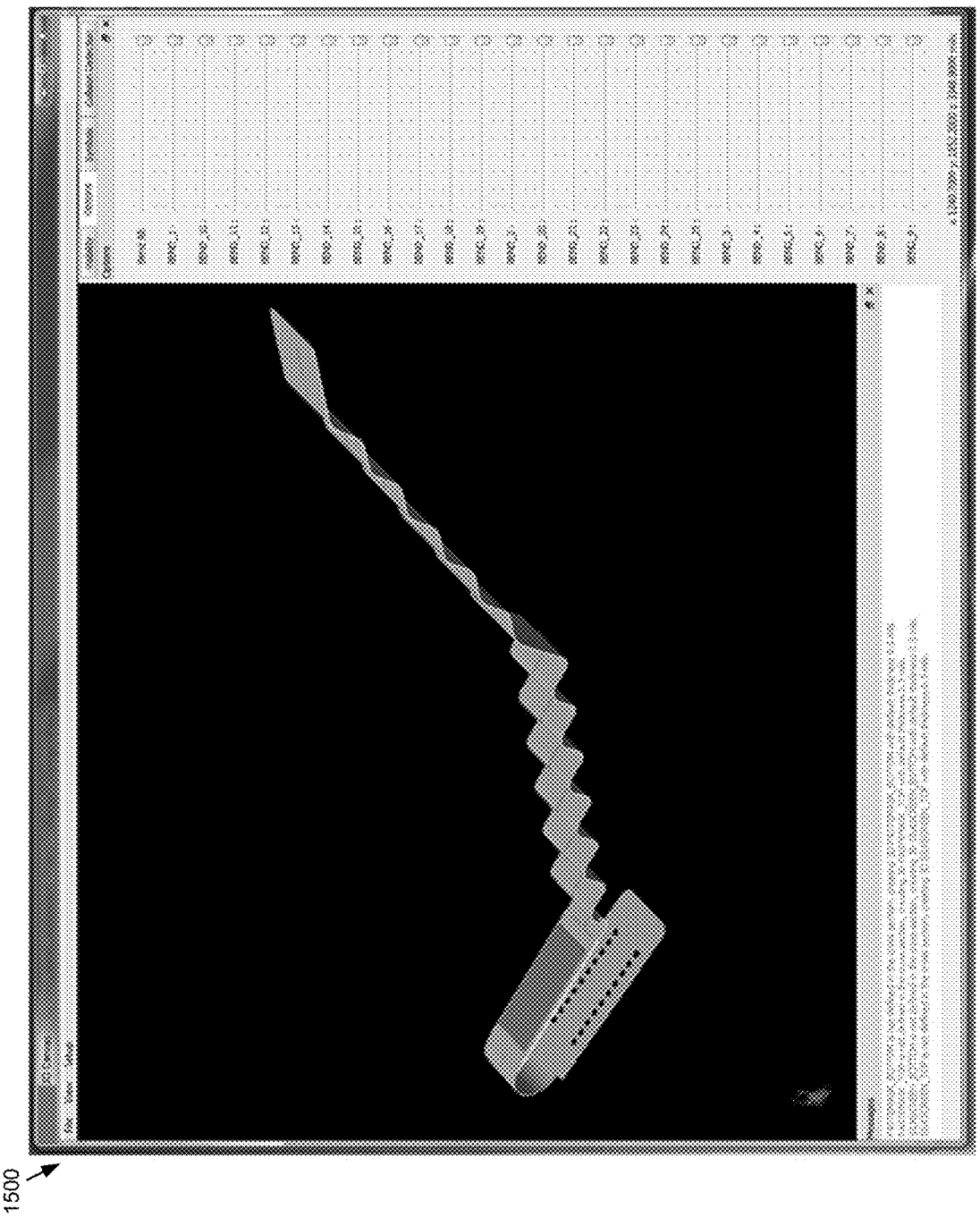
FIG. 15 is a graphical user interface depicting aspects of the ordering process in accordance with an embodiment of the present disclosure.

Referring now to FIGS. 14-15, additional exemplary embodiments consistent with ordering process 10 are provided. The GUIs provided in FIGS. 14-15 show a rigid-flex design in a 2D canvas. These figures also illustrate the ordering process 10 operating upon a design with multiple bend hierarchy fan-outs on both sides. In this particular example, two sets of bend hierarchies are established as shown in FIG. 14:

BEND_1
BEND_2:BEND_3:BEND_4: . . . :BEND25

FIG. 15 shows a GUI 1500 displaying bending operations performed along bend lines illustrating two bend hierarchies.

Figure 16:
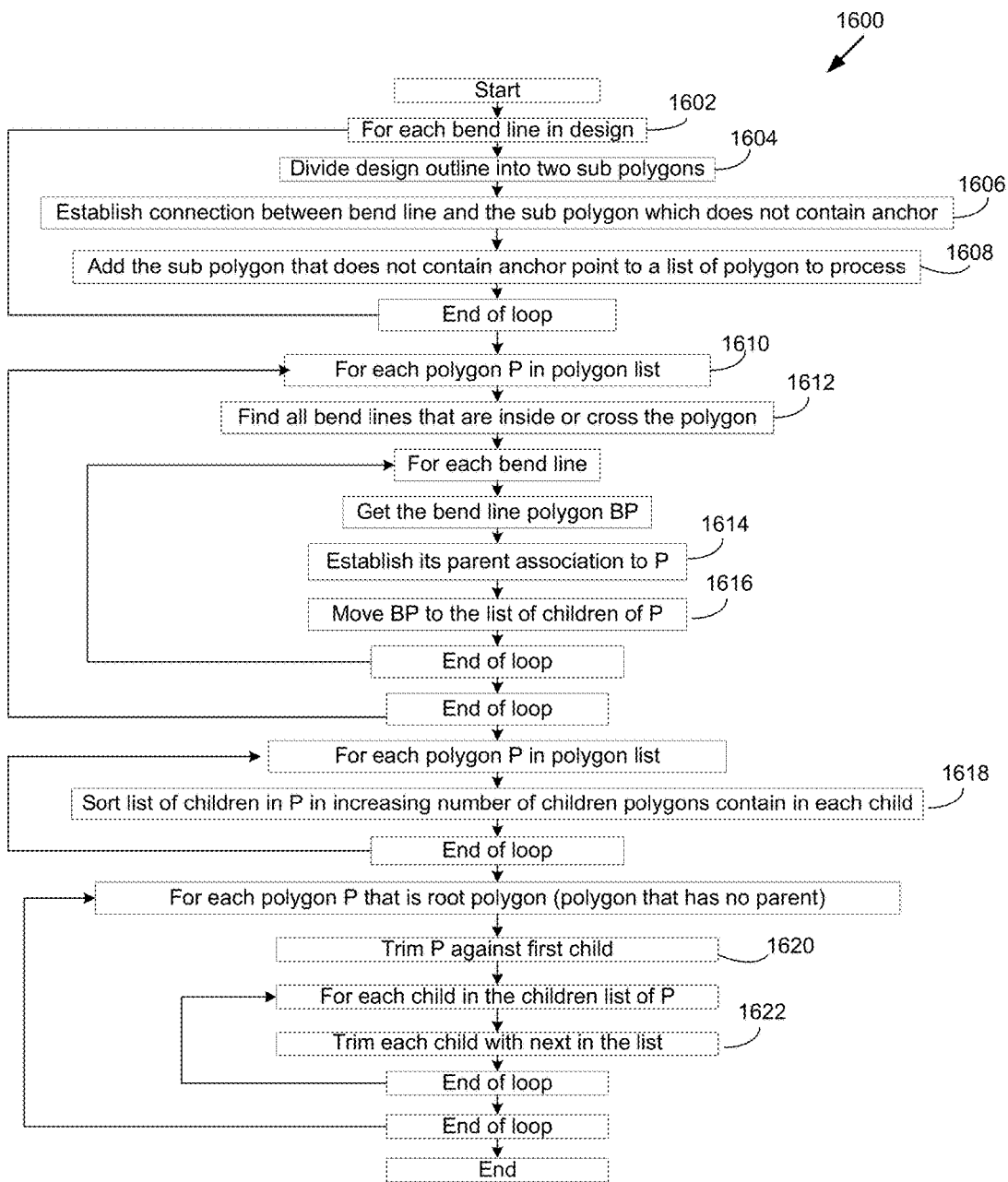
FIG. 16 is a flowchart depicting operations consistent with the ordering process of the present disclosure.

Referring also to FIG. 16, a flowchart 1600 depicting operations consistent with an embodiment of ordering process 10 is provided. The process may begin by identifying 1602 each bend line in a design and dividing 1604 a design outline into two sub-polygons. The process may establish 1606 a connection between a bend line and the sub-polygon that does not contain the anchor point. The sub-polygon that does not contain the anchor point may be added 1608 to a list of polygons to process. For each polygon "P" in a polygon list the process may locate 1610 all bend lines that are inside or cross the polygon. For each bend line, the process may obtain 1612 the bend line polygon and establish 1614 its parent association to P. The process may then move 1616 the bend polygon to the list of children of P. Additionally and/or alternatively, for each polygon P in the polygon list, the process may sort 1618 the list of children in P in an increasing number of children polygons contained in each child. For each polygon that is a root polygon (e.g. a polygon that has no parent), the process may trim 1620 P against the first child. For each child in the children list of P, the process may trim 1622 each child with the next in the list. As indicated in the flowchart some or all of the operations included in the process may be performed iteratively.

Embodiments of ordering process 10 provide numerous advantages over existing technologies. Ordering process 10 may calculate bend ordering automatically based on the anchor point. The exclusion area generated by ordering process 10 is much more accurate since it is generated automatically based on up to date bend data.

Using the teachings of the present disclosure, an exclusion area may be derived rather than relying on a user to define this area. User defined areas may become dated if the design outline is modified and the exclusion area is not manually updated as well. Embodiments included herein do not have this restriction.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support one or more software extensions, which may provide a high-throughput channel between the testbench and the device under test (DUT), and enable automated metric driven verification of embedded software exactly as if it were another part of the DUT.

In some embodiments, EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic circuit design comprising:
    providing, using a processor, an electronic design having a plurality of shapes associated therewith;
    displaying, at a graphical user interface, a first shape of the plurality of shapes;
    receiving, at the graphical user interface, a selection of an anchor point within the first shape, wherein the anchor point defines a fixed area associated with the first shape;
    identifying a plurality of bend lines associated with the plurality of shapes; and
    determining an ordering of bending of at least two of the plurality of shapes, wherein the ordering is based upon, at least in part, a distance from the anchor point.

2. The computer-implemented method of claim 1, wherein the plurality of shapes include polygons.

3. The computer-implemented method of claim 1, wherein at least a portion of the plurality of bend lines separate the plurality of shapes.

4. The computer-implemented method of claim 1, further comprising:
    dividing the first shape into a subset of shapes.

5. The computer-implemented method of claim 1, further comprising:
    determining at least one root parent in relation to the anchor point, wherein the root parent is a shape that is located nearer to the anchor point than a number of other shapes of the plurality of shapes.

6. The computer-implemented method of claim 5, further comprising:
    determining at least one child shape in relation to the at least one root parent.

7. The computer-implemented method of claim 1, further comprising:
    displaying at least one user selectable bending option at the graphical user interface.

8. A non-transitory computer-readable storage medium for use with an electronic circuit design, the computer-readable storage medium having stored thereon instructions that when executed by a machine result in the following operations:
    providing, using a processor, an electronic design having a plurality of shapes associated therewith;
    displaying, at a graphical user interface, a first shape of the plurality of shapes;
    receiving, at the graphical user interface, a selection of an anchor point within the first shape, wherein the anchor point defines a fixed area associated with the first shape;

identifying a plurality of bend lines associated with the plurality of shapes; and determining an ordering of bending of at least two of the plurality of shapes, wherein the ordering is based upon, at least in part, a distance from the anchor point.

9. The computer-readable storage medium of claim 8, wherein the plurality of shapes include polygons.

10. The computer-readable storage medium of claim 8, wherein at least a portion of the plurality of bend lines separate the plurality of shapes.

11. The computer-readable storage medium of claim 8, further comprising:

dividing the first shape into a subset of shapes.

12. The computer-readable storage medium of claim 8, further comprising:

determining at least one root parent in relation to the anchor point, wherein the root parent is a shape that is located nearer to the anchor point than a number of other shapes of the plurality of shapes.

13. The computer-readable storage medium of claim 12, further comprising:

determining at least one child shape in relation to the at least one root parent.

14. The computer-readable storage medium of claim 8, further comprising:

displaying at least one user selectable bending option at the graphical user interface.

15. A system comprising:

a computing device having at least one processor for use with an electronic circuit design, the at least one processor configured to receive an electronic design having a plurality of shapes associated therewith, the at least one processor further configured to display, at a graphical user interface, a first shape of the plurality of shapes, the at least one processor configured to receive, at the graphical user interface, a selection of an anchor point within the first shape, wherein the anchor point defines a fixed area associated with the first shape, the at least one processor further configured to identify a plurality of bend lines associated with the plurality of shapes and to determine an ordering of bending of at least two of the plurality of shapes, wherein the ordering is based upon, at least in part, a distance from the anchor point.

16. The system of claim 15, wherein the plurality of shapes include polygons.

17. The system of claim 15, wherein at least a portion of the plurality of bend lines separate the plurality of shapes.

18. The system of claim 15, wherein the at least one processor is further configured to divide the first shape into a subset of shapes.

19. The system of claim 15, wherein the at least one processor is further configured to determine at least one root parent in relation to the anchor point, wherein the root parent is a shape that is located nearer to the anchor point than a number of other shapes of the plurality of shapes.

20. The system of claim 15, wherein the at least one processor is further configured to determine at least one child shape in relation to the at least one root parent.

* * * * *